US 9,385,673 B2

(12) United States Patent
Ahmad et al.

(10) Patent No.: US 9,385,673 B2
(45) Date of Patent: Jul. 5, 2016

(54) AMPLIFIER WITH OFFSET COMPENSATION

(71) Applicant: ANALOG DEVICES GLOBAL, Hamilton (BM)

(72) Inventors: Fazil Ahmad, Santa Clara, CA (US); Gavin P. Cosgrave, Enniscorthy (IE)

(73) Assignee: Analog Devices Global, Hamilton (BM)

( * ) Notice: Subject to any disclaimer, the term of this patent is extended or adjusted under 35 U.S.C. 154(b) by 3 days.

(21) Appl. No.: 14/321,426

(22) Filed: Jul. 1, 2014

(65) Prior Publication Data
US 2015/0236648 A1    Aug. 20, 2015

Related U.S. Application Data

(60) Provisional application No. 61/940,204, filed on Feb. 14, 2014.

(51) Int. Cl.
*H03F 1/02*         (2006.01)
*H03F 3/45*         (2006.01)
*H03F 1/32*         (2006.01)

(52) U.S. Cl.
CPC .......... *H03F 3/45977* (2013.01); *H03F 1/3211* (2013.01); *H03F 3/45475* (2013.01); *H03F 2200/03* (2013.01); *H03F 2200/375* (2013.01); *H03F 2203/45138* (2013.01); *H03F 2203/45522* (2013.01)

(58) Field of Classification Search
CPC ..................................... H03F 1/02; H03F 3/45
USPC .......................................... 330/9, 69; 327/307
See application file for complete search history.

(56) References Cited

U.S. PATENT DOCUMENTS

| 4,086,541 | A | 4/1978 | Katou et al. |
| 6,486,818 | B1 | 11/2002 | Nicholson et al. |
| 7,302,246 | B2 | 11/2007 | Tseng et al. |
| 2012/0274381 | A1* | 11/2012 | Pyo .................... G01R 33/0029 327/307 |

FOREIGN PATENT DOCUMENTS

| JP | 60-087509 | 5/1985 |
| JP | 61-187404 | 8/1986 |
| JP | 2006-174122 | 6/2006 |

(Continued)

OTHER PUBLICATIONS

Analog Devices, AD8330 Data Sheet: Low Cost, DC to 150 MHz Variable Gain Amplifier, Rev. F, Nov. 2012, 32 pages. Available at http://www.analog.com/static/imported-files/data_sheets/AD8330.pdf (accessed on Feb. 28, 2014).

(Continued)

*Primary Examiner* — Steven J Mottola
(74) *Attorney, Agent, or Firm* — Knobbe, Martens, Olson & Bear, LLP

(57) ABSTRACT

Aspects of this disclosure relate to compensating for a relatively large offset in a signal generated by a sensor, such as a pressure sensor and/or a resistive bridge based sensor. Such offset compensation can include applying an offset correction signal generated by a configurable voltage reference, such as a voltage mode digital-to-analog converter (DAC), to an input of an amplifier included in an instrumentation amplifier to compensate for the offset of the signal generated by the sensor.

23 Claims, 5 Drawing Sheets

(56) References Cited

FOREIGN PATENT DOCUMENTS

| | | |
|---|---|---|
| JP | 2008-205560 | 9/2008 |
| JP | 2008-227712 | 9/2008 |
| JP | 2009-141639 | 6/2009 |
| JP | 2010-171863 | 8/2010 |
| JP | 4797734 | 10/2011 |
| JP | 2012-195825 | 10/2012 |
| JP | 2013-176009 | 9/2013 |

OTHER PUBLICATIONS

Analog Devices, AD8338 Data Sheet: Low Power, 18 MHz Variable Gain Amplifier, Rev. A, Nov. 2013, 20 pages. Available at http://www.analog.com/static/imported-files/data_sheets/AD8338.pdf (accessed on Jan. 21, 2015).

Texas Instruments, TPIC83000-Q1 Data Sheet: Pressure Sensor Signal Conditioning Interface, Nov. 2009. 47 pages. Available at http://www.ti.com/lit/ds/slds171/slds171.pdf (accessed on Jan. 21, 2015).

ZMDI, ZSSC3170 Data Sheet: Automotive Sensor Signal Conditioner with LIN and PWM Interface, Rev. 2.20, Jul. 5, 2013. 29 pages. Available at http://zmdi.cdistore.com/datasheets/zmdi/ZSSC3170_Data_Sheet_Rev_2_20_2013-07-05.pdf (accessed on Jan. 21, 2015).

Japanese Office Action mailed Dec. 8, 2015 for Japanese Patent Application No. 2015-016725, filed Jan. 30, 2015. 7 pages, 11 page translation.

Korean Office Action of Apr. 8, 2016 for Korean Patent Application No. 10-2015-18621 filed Feb. 6, 2015. 8 pages, 10 page translation.

\* cited by examiner

AMPLIFIER WITH OFFSET COMPENSATION

CROSS REFERENCE TO RELATED APPLICATION

This application is a non-provisional of and claims the benefit under 35 U.S.C. §119(e) of U.S. Provisional App. No. 61/940,204, filed Feb. 14, 2014, titled "AMPLIFIER WITH OFFSET COMPENSATION," the entire disclosure of which is hereby incorporated by reference herein.

TECHNICAL FIELD

The disclosed technology relates to electronics, and, more particularly, to compensating for offsets.

DESCRIPTION OF THE RELATED TECHNOLOGY

Certain sensors generate an output signal having an offset component that is large relative to a signal component. Such a relatively large offset component can have a magnitude that is a multiple, such as on the order of about 10 times to about 100 times, of a magnitude of the corresponding signal component. For example, some pressure sensors can generate an output signal with a sensitivity of about a 60 millivolts per volt (mV/V) offset component and about a 1 mV/V signal component, where the sensitivity represents the full scale expected change in output voltage versus an excitation voltage or supply voltage for the sensor. In this example, the offset component can consume most of the dynamic range of an amplifier that amplifies the sensor output signal. Accordingly, the amplifier can be saturated. To prevent saturation, a lower gain setting of the amplifier can be implemented. However, the lower gain setting can reduce the signal-to-noise ratio (SNR) in certain applications. In addition, a relatively high resolution analog-to-digital converter (ADC) that can be expensive to implement could otherwise be needed with the lower gain setting in certain applications. Ideally, the signal component of the sensor output signal would occupy the entire dynamic range of the amplifier and offset would be zero.

Accordingly, a strong need for sensor offset cancellation exists.

SUMMARY OF CERTAIN INVENTIVE ASPECTS

One aspect of this disclosure is an apparatus that includes an instrumentation amplifier and a configurable voltage reference. The instrumentation amplifier has at least a first stage that includes a first amplifier, a second amplifier, and a resistive network. The first amplifier has at least a first non-inverting input terminal and a first inverting input terminal. The second amplifier has at least a second non-inverting input terminal and a second inverting input terminal. The resistive network is configured to set a first gain of the first amplifier and set a second gain of the second amplifier. The resistive network is operatively coupled to the first inverting input terminal and the second inverting input terminal. The configurable voltage reference is operatively coupled to the instrumentation amplifier. The configurable voltage reference is configured to apply a first offset correction voltage to the first inverting input terminal and apply a second offset correction voltage to the second inverting input terminal. The first and second offset correction voltages are configured to compensate for an offset voltage in differential voltage signals received at the first non-inverting input terminal and the second non-inverting input terminal.

Another aspect of this disclosure is a method of compensating for an offset in a sensor output. The method includes receiving, from a sensor, a sensor output at a non-inverting input terminal of a first amplifier included in an instrumentation amplifier. The sensor output comprises an offset component and a signal component. The method also includes generating an offset correction signal at a negative input terminal of the first amplifier using a voltage mode digital-to-analog converter (DAC) to substantially cancel the offset component of the senor output. The method further includes amplifying the sensor output using the first amplifier.

Yet another aspect of this disclosure is an electronic system that includes a sensor, a first amplifier, and a configurable voltage reference. The sensor is configured to generate a differential sensor output, the differential sensor output comprising an offset component and a signal component. The first amplifier has a first amplifier gain set by a first resistive feedback network. The first amplifier comprises a non-inverting input terminal configured to receive a positive portion of the differential sensor output and an inverting input terminal operatively coupled to the first resistive feedback network. The second amplifier has a second amplifier gain set by a second resistive feedback network. The second amplifier comprises a non-inverting input terminal configured to receive a negative portion of the differential sensor output and an inverting input terminal operatively coupled to the second resistive feedback network. The configurable voltage reference is configured to apply a first offset correction signal to the inverting input terminal of the first amplifier and a second offset correction signal to the inverting terminal of the second amplifier to substantially cancel the offset component of the sensor output.

For purposes of summarizing the disclosure, certain aspects, advantages and novel features of the inventions have been described herein. It is to be understood that not necessarily all such advantages may be achieved in accordance with any particular embodiment of the inventions. Thus, the inventions may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1:
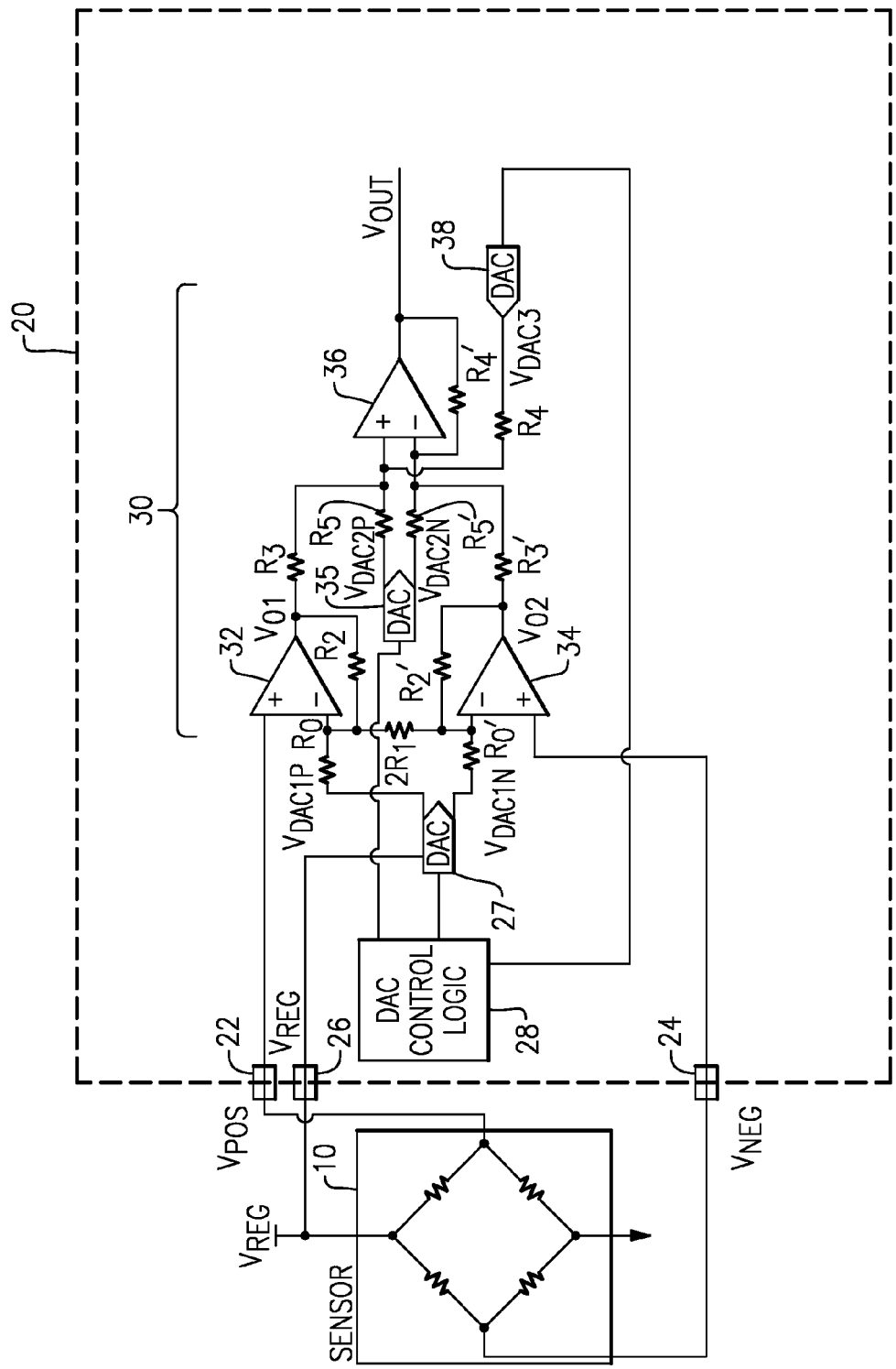
FIG. 1 is a schematic diagram of an instrumentation amplifier configured to receive a sensor output from a sensor and cancel an offset in the sensor output using digital-to-analog converters (DACs), according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale.

As discussed above, sensors or transducers can generate an output signal having an offset component that is large relative to a signal component in the output signal. Such sensors can include pressure sensors, strain gauges, load cells, relative humidity sensors, resistance temperature devices (RTDs), thermistors, and the like, and can be implemented with resistive Wheatstone bridge circuits. As one example, high pressure sensors used for in-cylinder measurement in diesel engines can have relatively large offsets. In an illustrative example, a sensor output signal can have an offset component of about 300 mV and a signal component of about 5 mV. This can make accurate amplification of the signal component difficult. The offset component of the sensor output signal can consume most or all of the dynamic range of an amplifier that amplifies the sensor output signal. This can make signal conditioning particularly difficult. For instance, the offset component can consume a significant portion of the dynamic range of an amplifier, and signal strength can also be degraded when the sensor output signal with a large offset component is amplified. For instance, in some applications, the signal strength can be degraded by about 40 decibels (dB) or more.

A number of electronic systems, such as systems that include pressure sensors, can use relatively high precision (for example, at least 10 to 12 bits of precision) and relatively high resolution (for example, at least 12 to 14 bits of resolution). In an illustrative example, if dynamic range of the offset component is about 35 dB larger than the signal component in the sensor output signal, 6 bits of resolution can be lost just due to the offset component. To achieve 12 to 14 bits of resolution in such circumstances, an 18 bit ADC may be used. An ADC with additional bits can be more difficult to design, consume more area, and consume more power. This can make an electronic system that includes the ADC more expensive.

Aspects of this disclosure relate to reducing an offset component of a sensor output signal prior to amplifying the sensor output signal. The sensor output signal can be amplified after offset cancellation. By removing a significant portion of the offset component from the sensor output signal before amplification, most or substantially all of the dynamic range of the amplifier can be used to amplify the signal component of the sensor output signal. This can meet accuracy and/or resolution specifications of an electronic system without adding additional bits to an ADC to account for an offset in the sensor output signal. It can be desirable to cancel some or all of the offset component in sensor output signals with a relatively large offset component relative to a signal component. For instance, by canceling a significant portion of the offset component, an amplifier can amplify more of the signal component and less of the offset component.

The offset cancelation discussed herein can be implemented at an input of one or more stages of an amplifier, such as an instrumentation amplifier. For instance, an electronic system can include a sensor configured to generate a sensor output having an offset component and a signal component, in which the offset component is large relative to the signal component. An amplifier can have a gain that is set by a resistive feedback network. A non-inverting input terminal of the amplifier can receive the sensor output and an inverting input terminal of the amplifier can be operatively coupled to the resistive feedback network. A configurable voltage reference, such as a DAC, can provide a voltage reference that can be used to reduce an offset. For instance, a voltage mode continuous time DAC can apply an offset correction signal to the inverting input terminal of the amplifier to substantially cancel the offset component of the sensor output. Such a DAC can include a resistor string DAC or an R2R DAC. In some embodiments, both the sensor and the DAC can be electrically coupled to the same reference voltage. Accordingly, as the sensor offset changes due to drift in the reference voltage, the offset correction signal can change in a ratiometric relationship. A ratiometric relationship can represent one signal being directly proportional to another signal. According to certain embodiments, one or more impedances of the resistive feedback network can be adjustable. This can adjust the amplifier gain. In some of these embodiments, a sum of certain adjustable impedances of the resistive feedback network can remain substantially constant.

In an embodiment, a first stage of an instrumentation amplifier includes a first amplifier, a second amplifier, and a resistive network configured to set a first gain of the first amplifier and set a second gain of the second amplifier. A DAC can generate a first offset correction signal for the first amplifier and a second offset correction signal for the second amplifier. The DAC can be implemented as two separate DACs, one for the first amplifier and one for the second amplifier. The DAC can be a voltage mode DAC or a current mode DAC used with an I-V converter stage at its output. The DAC can generate voltages that are applied via resistors to the input terminals of the amplifiers. Accordingly, the offset correction signals received at input terminals of such amplifiers can be currents in some embodiments. The offset correction signals can alternatively be voltage signals in certain embodiments. The first and second offset correction signals can compensate for an offset voltage in differential voltage signals received by the first and second amplifiers, respectively. The differential voltage signals can be received from a sensor. The DACs can separately control the first offset correction voltage and the second offset correction voltage. A register in control logic can store one or more DAC codes determined during factory calibration to generate the first and second offset correction voltages.

Offset cancelation can be added to an instrumentation amplifier, such as a voltage mode instrumentation amplifier. Instrumentation amplifiers can be precision gain blocks that amplify a differential input. Instrumentation amplifiers can amplify the difference between differential input voltages while rejecting signals that are common to both inputs. Instrumentation amplifiers can be implemented in a variety of applications, such as applications in which direct current (DC) precision and gain accuracy should be maintained within a noisy environment and/or where relatively large common-mode signals or common-mode noise (for example, noise from ripple from the rectified alternating current of an automotive alternator, noise from an automotive ignition system, etc.) are present. Example applications for instrumentation amplifiers include industrial, measurement, data acquisition, automotive, and medical applications. Some instrumentation amplifiers are programmable to substantially fixed gain levels. A gain level can be selected digitally by dedicated input contacts and/or by interfaces, such as SPI (Serial-Peripheral interface) or I²C (Inter-Integrated Circuit). Programmable gain instrumentation amplifiers are typically well suited for applications where maximizing gain accuracy is desirable and/or where a single programmable gain amplifier can replace several separate instrumentation amplifiers having different gain settings.

FIG. 1 is a schematic diagram of an instrumentation amplifier configured to receive a sensor output from a sensor and cancel an offset in the sensor output using digital-to-analog converters (DACs), according to an embodiment. The illustrated instrumentation amplifier is a voltage mode instrumentation amplifier. Voltage mode instrumentation amplifiers can be well suited to amplify differential signals from resistive bridge based sensors.

The electronic system illustrated in FIG. 1 includes a sensor or transducer 10 and an integrated circuit 20 that includes a first DAC 27, DAC control logic 28, an instrumentation amplifier 30, a second DAC 35, and a third DAC 38. The first DAC 27, the second DAC 35, and the third DAC 38 can each be a voltage mode continuous time DAC. Each DAC shown in FIG. 1 can be implemented by two DACs. Alternatively or additionally, each DAC shown in FIG. 1 can be a DAC having a differential output. The illustrated sensor 10 is a resistive Wheatstone bridge based sensor with at least one resistive element of the bridge varying with the parameter being sensed. The sensor 10 can be a pressure sensor in some embodiments and can have all 4 resistive elements varying with pressure. As one example, the sensor 10 can be used in automotive applications, such as to measure pressure in a combustion chamber of an automobile engine. The sensor 10 can generate sensor output signals having offset components that are large relative to the respective signal components. The sensor 10 can provide differential voltages Vpos and $V_{NEG}$ to first and second input contacts 22 and 24, respectively, of the integrated circuit 20. The integrated circuit 20 can also receive a reference voltage $V_{REG}$ at a third input contact 26. The reference voltage $V_{REG}$ can be a regulated voltage, such as a supply voltage intended for analog circuits. The reference voltage $V_{REG}$ can be generated by the same source as the reference voltage used by the sensor 10 as an excitation voltage. The sensor 10 can alternatively be excited by a current. Approximately the same reference voltage $V_{REG}$ can be used by the sensor 10 and the DAC 27. Similarly, approximately the same reference voltage $V_{REG}$ can be used by the sensor 10 and the DACs 35 and/or 38. The outputs of any combination of some or all of the DACs 27, 35, and 38 can be ratiometric to the outputs of the sensor 10. The input contacts 22, 24, and 26 can be pins, for example. The integrated circuit 20 can be a sensor signal conditioner, such as an automotive sensor signal conditioner and/or a pressure sensor signal conditioner, according to certain embodiments.

As illustrated, the instrumentation amplifier 30 includes a first stage and a second stage. The first stage includes a first amplifier 32 and a second amplifier 34. The second stage includes a third amplifier 36. The amplifiers 32, 34, 36 can be operational amplifiers. A non-inverting input terminal of the first amplifier 32 can receive a positive output voltage $V_{POS}$ from the sensor 10. A non-inverting input terminal of the second amplifier 34 can receive a negative output voltage $V_{NEG}$ from the sensor 10.

The gains of the first and second amplifiers 32 and 34, respectively, can be set by a resistive network. In the embodiment shown in FIG. 1, the resistive network for the first stage of the instrumentation amplifier 30 includes resistances $R_0$, $R_0'$, $2R_1$, $R_2$, and $R_2'$. The resistance $2R_1$ can be implemented by two resistors connected in series and each having a resistance of $R_1$. One or more of these resistances can be programmable, for example, as will be discussed in more detail later. In FIG. 1, the resistance $2R_1$ is coupled between the inverting input terminals of the first amplifier 32 and the second amplifier 34, the resistance $R_2$ is in a feedback path between an output of the first amplifier 32 and the inverting input terminal of the first amplifier 32, and the resistance $R_2'$ in a feedback path between an output of the second amplifier 34 and the inverting input terminal of the second amplifier 34. In FIG. 1, the resistance $R_0$ is coupled between an output of the DAC 27 and the inverting input terminal of the first amplifier 32 and the resistance $R_0'$ is coupled between an output of the DAC 27 and the inverting input terminal of the second amplifier 34.

The difference between the output voltages of the amplifiers 32 and 34 of the first stage of the instrumentation amplifier 30 can be represented by Equation 1:

$$V_{O1} - V_{O2} = (V_{POS} - V_{NEG})\left(1 + \frac{R_2 + R_2'}{2R_1}\right) + \frac{V_{POS}R_2}{R_0'} - \frac{V_{NEG}R_2'}{R_0'} - \frac{V_{DACP1}}{R_0} + \frac{V_{DACN1}R_2'}{R_0'} \quad \text{(Eq. 1)}$$

In Equation 1, $V_{O1}$ represents the output voltage of the first amplifier 32, $V_{O2}$ represents the output voltage of the second amplifier 34, $V_{POS}$ represents the positive input voltage of the first stage of the instrumentation amplifier 30, $V_{NEG}$ represents the inverted input voltage of the first stage of the instrumentation amplifier 30, $V_{DACP1}$ represents an offset correction voltage that is a first output of the first DAC 27 that is applied to the resistor $R_0$, which is electrically connected to the inverting input terminal of the first amplifier 32, and $V_{DACN1}$ represents an offset correction voltage that is a second output of the first DAC 27 that is applied to the resistor $R_0'$, which is electrically connected to the inverting input terminal of the second amplifier 34. The resistances in Equation 1 correspond to the resistances shown in FIG. 1.

The differential input voltages $V_{POS}$ and $V_{NEG}$ can have a relatively large offset voltage. The offset correction voltages $V_{DAC1P}$ and $V_{DAC1N}$ can help compensate for such a relatively large offset. In some instances, the offset correction voltages $V_{DAC1P}$ and $V_{DAC1N}$ can substantially minimize the output of the first stage of the instrumentation amplifier 30 within the dynamic range of the instrumentation amplifier 30. To reduce common mode gain, the offset correction voltages $V_{DAC1P}$ and $V_{DAC1N}$ can be set to have a common mode voltage that is similar to the common mode voltage of the differential inputs voltages $V_{POS}$ and $V_{NEG}$. The common mode gain can represent a contribution of the amplifier output that results from a common mode voltage. Equation 2 represents the common mode of the differential input voltages $V_{POS}$ and $V_{NEG}$ being approximately equal to the common mode of the offset correction voltages $V_{DAC1P}$ and $V_{DAC1N}$:

$$\frac{V_{POS} + V_{NEG}}{2} \approx \frac{V_{DAC1P} + V_{DAC1N}}{2} \quad \text{(Eq. 2)}$$

The offset correction voltages $V_{DAC1P}$ and $V_{DAC1N}$ applied to the inverting input terminals of the first amplifier 32 and the second amplifier 34, respectively, can ensure that most or all of the dynamic range of the first stage of the instrumentation amplifier 30 is used to amplify the signal component of the differential voltages $V_{POS}$ and $V_{NEG}$ generated by the sensor 10. Similar principles can be applied to correct for voltage offsets to the inputs of the second stage of the instrumentation amplifier 30. Such offset correction can ensure relatively high resolution and/or dynamic range. A third stage of offset cancelation in the instrumentation amplifier 30 can tune the output voltage to a finer resolution. More details of regarding setting DAC codes for the various stages of offset correction in the instrumentation amplifier 30 will be discussed later.

The gain of the third amplifier 36 can be set by a resistive network for the second stage of the instrumentation amplifier 30. In the embodiment shown in FIG. 1, the resistive network for the second stage of the instrumentation amplifier 30 includes resistances $R_3$, $R_3'$, $R_4$, $R_4'$, $R_5$, and $R_5'$. One or more of these resistances can be programmable, that is, adjustable. In FIG. 1, the resistance $R_3$ is coupled between the output terminal of the first amplifier 32 and the non-inverting input terminal of the third amplifier 36, and the resistance $R_3'$ is coupled between the output terminal of the second amplifier 34 and the inverting input terminal of the third amplifier 36. As also illustrated in FIG. 1, the resistance $R_4'$ is coupled between an output terminal of the third amplifier 36 and the inverting input terminal of the third amplifier 36, and the resistance $R_4$ is coupled between an output of the DAC 38 and the non-inverting input terminal of the third amplifier 36. Additionally, in the embodiment of FIG. 1, the resistance $R_5$ is coupled between an output of the DAC 35 and the non-inverting input terminal of the third amplifier 36 and the resistance $R_5'$ is coupled between an output of the DAC 35 and the inverting input terminal of the third amplifier 36.

The output voltage $V_{OUT}$ of the instrumentation amplifier 30 can be represented by Equation 3:

$$V_{OUT} = \left(\frac{R_4 V_{O1}}{R_3} - \frac{R_4 V_{O2}}{R_3'}\right) + \left(\frac{R_4' V_{DAC2P}}{R_5} - \frac{R_4' V_{DAC2N}}{R_5'}\right) + \left(\frac{R_4' V_{DAC3}}{R_4}\right) \quad \text{(Eq. 3)}$$

In Equation 3, $V_{O1}$ represents the output voltage of the first amplifier 32, $V_{O2}$ represents the output voltage of the second amplifier 34, $V_{DAC2P}$ represents an offset correction voltage applied to the resistor $R_5$, which is coupled to the non-inverting input terminal of the third amplifier 36, $V_{DAC2N}$ represents an offset correction voltage applied to the resistor $R_5'$, which is coupled to the inverting input terminal of the third amplifier 36, and $V_{DAC3}$ represents an offset correction voltage generated by the DAC 38. The resistances in Equation 1 correspond to the resistances shown in FIG. 1. While the output voltage $V_{OUT}$ is illustrated as a single voltage in FIG. 1, the output voltage $V_{OUT}$ can be a differential output voltage in some other implementations.

The offset correction voltages $V_{DAC2P}$ and $V_{DAC2N}$ can further refine offset correction. For example, the offset correction voltages $V_{DAC2P}$ and $V_{DAC2N}$ can correct for a common mode offset and/or a differential offset present in the differential output of the first stage of the instrumentation amplifier 30. Such offset correction can result in high resolution and/or dynamic range. The offset correction voltage $V_{DAC3}$ generated by the DAC 38 can tune the output voltage $V_{OUT}$ of the instrumentation amplifier 30 to a finer resolution. The input referred resolution of the DACs 35 and 38 can higher than the DAC 27. This can increase offset correction resolution. In addition, the input offset correction range of the DAC 35 and 38 can be lower than the DAC 27.

The resistive network in the first stage of the instrumentation amplifier 30 can adjust the gain to a selected one of a plurality of different first stage gain settings. For instance, in one embodiment, the first stage can have three gain settings. Similarly the resistive network in the second stage of the instrumentation amplifier 30 can adjust the gain to a selected one of a plurality of different second stage gain settings. As an example, the second stage can have 12 different gain settings in one embodiment. The total gain of the instrumentation amplifier 30 can be selected from the range from about 2 to about 1000 in some embodiments. The different gain settings can be selected by setting the impedances of one or more of the resistors R0, R0', 2R1, R2, R2', R3, R3', R4, R4', R5, or R5'.

One or more DAC codes can be determined during factory calibration. These DAC codes can cancel some or all of the offset component in the sensor output signal and/or cancel some or all of the effects of common mode variation. The DAC codes can be stored in registers of the DAC control logic 28. The DAC control logic 28 can be implemented by any suitable circuit configured to provide a DAC with a DAC code. The DAC codes can alternatively or additionally be stored in other suitable memory elements, such as EEPROM, fuses, other suitable non-volatile memory, or the like. Such DAC codes can be loaded into the DAC control logic 28. In one example offset calibration algorithm, 6 bits can be used for common mode correction, 6 bits can be used for first stage offset trimming, 5 bits can be used for second stage offset trimming, and 7 bits can be used for third stage offset trimming.

One example of determining a common mode DAC code $V_{CM\_CODE}$ will now be described. The differential gain of the instrumentation amplifier 30 can be set to a lowest setting. An analog-to-digital converter (ADC) can detect an input common mode of the instrumentation amplifier 30. As one example, the ADC can measure a mid-point of resistor $2R_1$ to detect an input common-mode of the amplifier 30. The common mode DAC code $V_{CM\_CODE}$ for the DAC 27 can be set such that the DAC 27 causes offset correction voltages applied to inputs of the first stage of the instrumentation amplifier 30 to have approximately the same common mode as the differential input voltages $V_{POS}$ and $V_{NEG}$. In this process, the common mode DAC code $V_{CM\_CODE}$ can be determined by linear extrapolation using Equation 4. The common mode output of the first stage of the instrumentation amplifier 30 of FIG. 1 can be represented by Equation 4:

$$V_{CM\_1st} = V_{CMI} + \frac{R_2}{R_0}(V_{CMI} - V_{CMO\_1st}) \quad \text{(Eq. 4)}$$

In Equation 4, $V_{CM\_1st}$ represents the common mode output voltage of the first stage of the instrumentation amplifier 30, $V_{CMI}$ represents the common mode input voltage to the first stage of the instrumentation amplifier 30, and $V_{CMO\_1st}$ represents the common mode voltage of the offset correction voltages $V_{DAC1P}$ and $V_{DAC1N}$. In the first stage of the instrumentation amplifier 30, setting the common mode of the offset correction voltages to be equal to the common mode of the input voltage ($V_{CMI}=V_{CMO\_1st}$), the common mode of the output voltage will be equal to the common mode of the input voltage ($V_{CM\_1st}=V_{CMI}$), according to Equation 4.

The common mode DAC code $V_{CM\_CODE}$ can ensure that the input to the second stage of the instrumentation amplifier 30 has a common mode that is close to the input common mode of the first stage of the instrumentation amplifier 30. This can set the common mode voltage for the first and second stages of the instrumentation amplifier 30. DAC offset codes can be provided to the DACs 27, 35, and/or 38 to minimize error versus a desired target value.

Figure 2A:
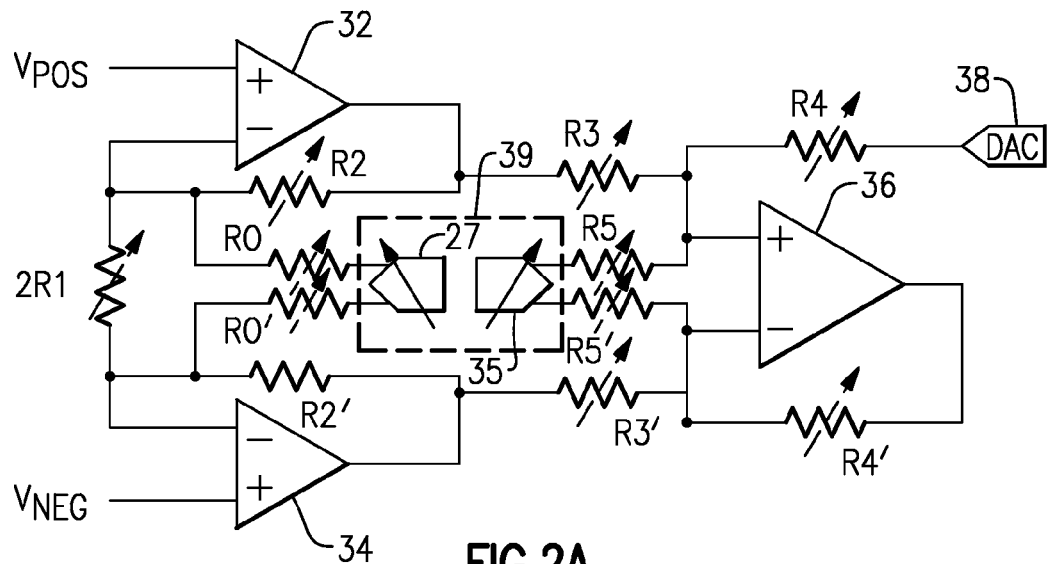
FIG. 2A is a schematic diagram of an embodiment of the instrumentation amplifier and a configurable voltage reference.

FIG. 2A is a schematic diagram of an embodiment of the instrumentation amplifier 30 and the DACs 27, 35, and 38 of FIG. 1. FIG. 2A illustrates that the resistances in the resistive networks that set the gains of the first stage and the second stage of the instrumentation amplifier 30 can be adjustable. With the adjustable resistances shown in FIG. 2A, the instrumentation amplifier 30 has a programmable gain. The DACs 27, 35, and 38 can implement any combination of the offset compensation features discussed herein.

Figure 2B:
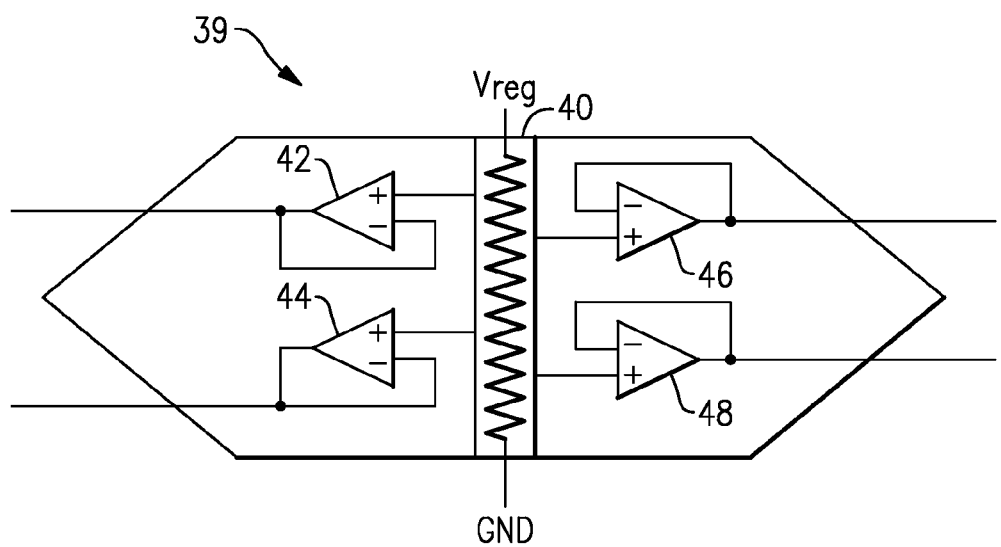
FIG. 2B is a schematic diagram of an embodiment of the configurable voltage reference of FIG. 2A that includes a voltage divider.

FIG. 2B is a schematic diagram of an embodiment of a configurable voltage reference 39 that implements the function of the first DAC 27 and the second DAC 35 of FIG. 2A. The configurable voltage reference 39 generates a voltage mode signal and applies the voltage mode signal to an inverting input of an amplifier and/or a non-inverting input of an amplifier. Accordingly, as used herein, a "configurable voltage reference" is intended to exclude a circuit that generates current mode signals that are summed at the inverting input of the amplifier, such as the first amplifier 32 and/or the second amplifier 34. The configurable voltage reference 39 includes a voltage divider having a plurality of tap points. The voltage divider can be a resistor divider, as illustrated. As shown in FIG. 2B, the configurable voltage reference 39 can share circuitry for generating offset correction voltages in different stages of the instrumentation amplifier 30 in certain embodiments. Sharing circuitry can reduce area, cost, power, the like, or any combination thereof. Although the configurable voltage reference 39 illustrated in FIG. 2B implements the first DAC 27 and the second DAC 35 with shared circuitry, the DACs 27 and 35 can each have separate voltage dividers other embodiments. In some embodiments, there can be a separate voltage divider for each DAC output. According to some embodiments, the DAC 27 and/or the DAC 35 can be implemented as four separate DACs each configured to generate an offset voltage or two separate DACs each configured to generate a differential offset voltage. The first DAC 27 and the second DAC 35 illustrated in FIG. 2B can both be voltage mode continuous time DACs.

The illustrated configurable voltage reference 39 includes a voltage divider 40 that includes a plurality of resistors in series between a reference voltage $V_{REG}$ and a ground potential Gnd. The voltage divider 40 serves as a voltage divider between the reference voltage $V_{REG}$ and the ground potential Gnd. Different tap points on the voltage divider 40 can be selectively operatively coupled to inputs of offset correction amplifiers 42, 44, 46, and 48 in response to control signals, such as digital control signals. In certain embodiments, the voltage divider 40 includes a resistor string DAC. In a resistor string DAC, different tap points on the resistor string can be selectively operatively coupled to inputs of offset correction amplifiers 42, 44, 46, and 48 in response to digital control signals.

The reference voltage $V_{REG}$ can be electrically coupled to the same reference voltage $V_{REG}$ as the sensor 10. Accordingly, the configurable voltage reference 39 can reduce and/or eliminate offset drift due to voltage reference drift. As such, the offset correction voltages can drift with the sensor output voltages. When the reference voltage of the sensor 10 is electrically coupled to the reference voltage $V_{REG}$ of the configurable voltage reference 39, the offset correction voltage can be ratiometric to the sensor output voltage.

Digital control signals (not shown) can open and close switches (not shown) to perform such operative coupling to provide analog voltages to the positive input terminals of the offset correction amplifiers 42, 44, 46, and 48. Each of the offset correction amplifiers 42, 44, 46, and 48 are configured as buffer amplifiers and can receive an analog voltage from the voltage divider 40 at a non-inverting input terminal and receive its output at the inverting input terminal to buffer the voltages. Other voltage buffer configurations can alternatively be used. The digital control signals can provide different voltages to each of the offset correction amplifiers 42, 44, 46, and 48. The digital control signals can comprise a first stage DAC code to provide selected analog voltage levels to the offset correction amplifiers 42 and 44 for the first stage of the instrumentation amplifier 30 and a second stage DAC code to provide selected analog voltage levels to the offset correction amplifiers 46 and 48 for the second stage of the instrumentation amplifier 30. Accordingly, the offset correction voltages for the first stage of the instrumentation amplifier 30 and the second stage of the instrumentation amplifier 30 can be separately controllable. According to some embodiments, a separate DAC code can be provided to the voltage divider 40 for each of the offset correction amplifiers 42, 44, 46, and 48. In these embodiments, the offset correction voltages $V_{CM1}$, $V_{CM2}$, $V_{CM3}$, and $V_{CM4}$ for the instrumentation amplifier 30 can be separately controllable.

Figure 2C:
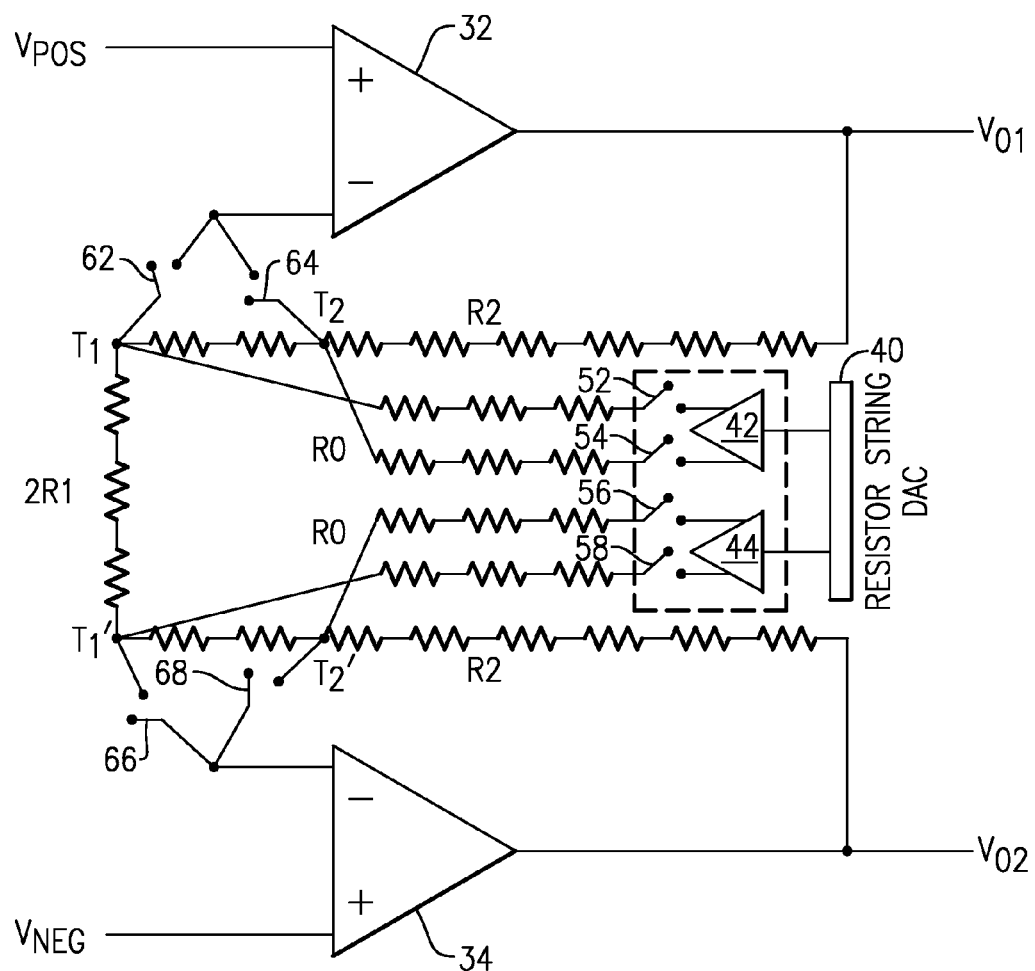
FIG. 2C is a schematic diagram illustrating circuitry configured to adjust impedances in a resistive network to adjust the gain of a first stage of the instrumentation amplifier of FIG. 2A and circuitry configured to operatively couple a resistor string between a DAC and the resistive network, according to an embodiment.

FIG. 2C is a schematic diagram illustrating circuitry configured to adjust impedances in a resistive network to adjust the gain of a first stage of the instrumentation amplifier 30 of FIG. 2A and circuitry to operatively couple a resistor string between the DAC and the resistive network, according to an embodiment. As discussed above, the adjustable impedances in the resistive network can make gain(s) of the instrumentation amplifier 30 programmable. The resistor string R0 can be used to compensate for a relatively wide offset correction range. As illustrated, the voltage divider 40 of FIG. 2C is a resistor string DAC. Other voltage dividers can alternatively be implemented.

In the illustrated embodiment, the impedances of resistors $2R_1$ and $R_2$ can be adjusted while the sum of the impedances of the resistors $2R_1$ and $R_2$ can remain substantially constant. A configurable gain setting, which can be provided by a user, can adjust the ratio of impedances of the resistors $2R_1$ and $R_2$ to set a desired gain of the first stage of the instrumentation amplifier 30. The programmable gain setting can couple the inverting input terminals of the first amplifier 32 and the second amplifier 34 to different tap points on an R1-R2 resistive ladder to adjust the gain of the first stage of the instrumentation amplifier 30.

The programmable gain setting can cause a selected one of the gain setting switches 62 and 64 to operatively couple the inverting input terminal of the first amplifier 32 to a selected tap point $T_1$ or $T_2$ on a resistor string to set the gain of the first amplifier 32. A different value of the gain setting can cause a different gain setting switch 62 or 64 to couple the inverting input terminal of the first amplifier 32 to a different tap point $T_1$ or $T_2$ on a resistor string to thereby change the gain of the first amplifier 32. Similarly, the programmable gain setting can cause a selected one of the gain setting switches 66 and 68 to operatively couple the inverting input terminal of the second amplifier 34 to a selected tap point $T_1'$ or $T_2'$ on a resistor string to set the gain of the second amplifier 34. A different value of the gain setting can cause a different gain setting switch 66 or 68 to couple the inverting input terminal of the second amplifier 34 to a different tap point $T_1'$ or $T_2'$ on a resistor string to thereby change the gain of the second amplifier 34.

As an example, the programmable gain setting can adjust the gain of the first amplifier 32 by coupling the inverting input terminal of the first amplifier 32 to second tap point $T_2$ instead of the first tap point $T_1$. This can cause the resistance R2 to decrease and the resistance 2R1 to correspondingly increase. Accordingly, the gain in the first stage of the instrumentation amplifier 30 can change, for example, in accordance with Equation 1. Similarly, the inverting input terminal of the second amplifier 34 can be operatively coupled to fourth tap point $T_2'$ instead of the third tap point $T_1'$ responsive to the programmable gain setting to reduce the resistance $R_2$ by approximately the same amount as the resistance $2R_1$ is increased. As another example, by coupling the inverting input terminal of the first amplifier 32 to first tap point $T_1$ instead of the second tap point $T_2$, the resistance $R_2$ can increase and the resistance $2R_1$ can correspondingly decrease.

While two switches and two tap points are shown in connection with the inverting input terminal of the first amplifier 32 and two different taps points are shown in connection with the inverting input terminal of the second amplifier 34 for illustrative purposes, it will be understood that any suitable number of switches and tap points can be implemented to make the instrumentation amplifier 30 programmable to have a desired number of different programmable gains.

A gain setting switch 62 or 64 is within a feedback loop of the first amplifier 32 and should not create significant variation due to changes in switch resistance due to changes in temperature. Overall switch resistance should be a small factor relative to the gain of the first amplifier 32. Similarly, a gain setting switch 66 or 68 is within the second amplifier 34 feedback loop and should not create significant variation due to changes in switch resistance due to changes in temperature.

Different resistor strings having a resistance $R_0$ are coupled to different tap points in the $R_1$-$R_2$ resistive ladder. As shown in FIG. 2C, one end of each resistor string can be connected to each tap point $T_1$, $T_2$, $T_1'$, or $T_2'$ and the other end of each resistor string can be either be floating or connected to an offset correction amplifier 42/44 via switches 52 or 54/56 or 58. Floating resistor strings should not add more than a relatively small parasitic capacitance and a relatively small leakage current to a respective tap point. Since the switches 52, 54, 56, and 58 that connect respective resistor strings to an offset correction amplifier 42 or 44 can be sized to be small, such as close to or at a minimum switch size, leakage and parasitic capacitance associated with such switches can be relatively small.

The offset correction circuits of FIGS. 2A to 2C is well suited for correcting relatively large sensor offsets, such as a sensor output signal with an offset component of about 240 mV and a signal component of about 4 mV. Simulation results indicate that the offset correction of FIGS. 2A to 2C can cancel such offsets.

Figure 2D:
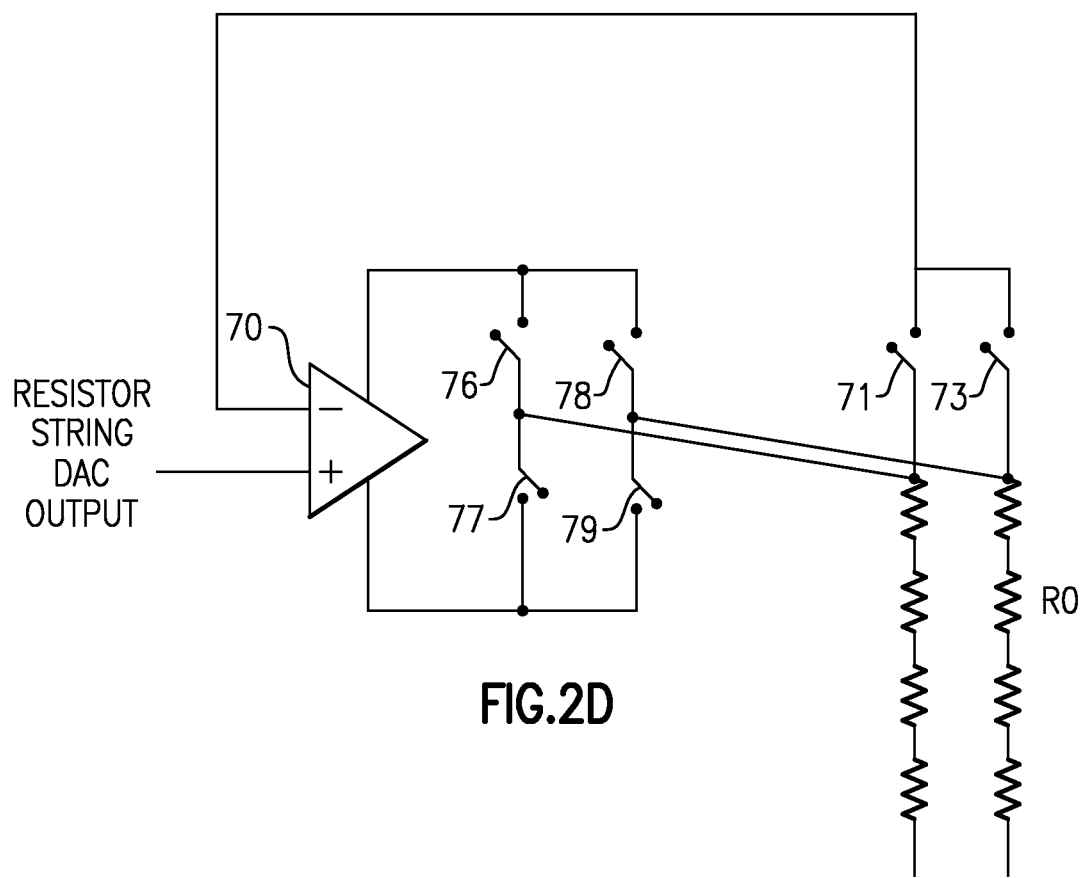
FIG. 2D is a schematic diagram illustrating an example embodiment in which a single amplifier is configured to drive switches to operatively couple a selected resistor string to a corresponding tap point.

FIG. 2D is a schematic diagram illustrating an example embodiment in which a single offset correction amplifier is configured to drive a plurality of resistor strings to corresponding tap points. As shown in FIG. 2D, a single offset correction amplifier 70 can receive an input voltage from a configurable voltage reference, such as a DAC, and drive multiple switches connected to multiple tap points. This can reduce the number of offset correction amplifiers. The offset correction amplifier 70 can provide an offset correction voltage to a selected tap point selectively coupling outputs of the offset correction amplifier 70 to a resistor string via switches 76 and 77/78 and 79. Switches 71 or 73 can selectively couple the resistor strings to an input terminal of the offset correction amplifier 70 to form a feedback path. When switches 71, 76, and 77 are closed, switches 73, 78, and 79 can be opened. Similarly, when switches 71, 76, and 77 are opened, switches 73, 78, and 79 can be closed. 73 open or vice versa. Such switching can maintain closed loops.

Figure 3:
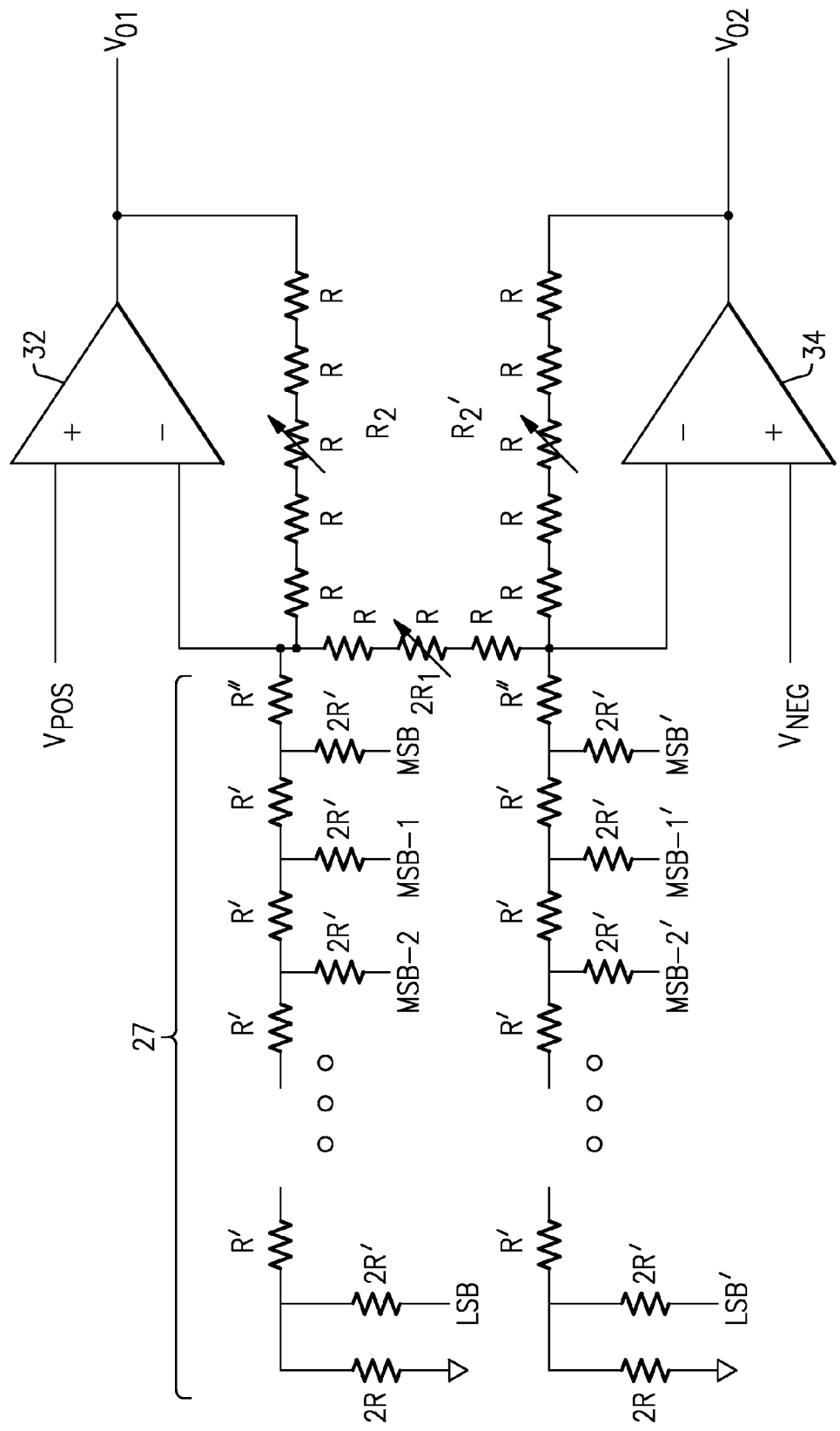
FIG. 3 is a schematic diagram of another embodiment of a first stage of the instrumentation amplifier with a configurable voltage reference that includes an R2R DAC.

FIG. 3 is a schematic diagram of another embodiment of a first stage of the instrumentation amplifier 30 and the first DAC 27 of FIG. 1, in which the first DAC 27 is an R2R DAC. An R2R DAC is another way to cancel a sensor offset using in the first stage of an instrumentation amplifier 30. The DAC 27 illustrated in FIG. 3 is a voltage mode continuous time DAC.

In the embodiment of FIG. 3, the resistances $R_1$ and $R_2$ are adjustable and the gains of the first amplifier 32 and the second amplifier 34 are programmable. The resistors of the R2R DAC can be separate and/or have different impedance values than the resistors in the resistive network for the first stage of the instrumentation amplifier 30. Similar 2R2 DACs can be implemented for offset cancellation in second stage of the instrumentation amplifier. The R2R DAC can receive a digital DAC code including data digits MSB, MSB-1, MSB-2 . . . LSB and convert the DAC code to an analog offset correction voltage at the inverting input of the first amplifier 32 and/or the second amplifier 34. Different DAC codes can be provided to the R2R DAC to apply different voltages to inverting input terminals of the first amplifier 32 and the second amplifier 34. The different DAC codes can enable the R2R DAC to separately control voltages applied to inverting input terminals of the first amplifier 32 and the second amplifier 34.

Implementing an R2R DAC can be less expensive to implement than the resistor string DAC of FIGS. 2A to 2C. For instance, the offset correction amplifiers of FIGS. 2A to 2C are not needed with the R2R DAC, as the R2R DAC can have a fixed output impedance. This can reduce the size of the first stage and the second stage of the instrumentation amplifier 30. With an R2R DAC, there would be no offset and/or no offset drift associated with the amplifiers of the configurable voltage references of FIGS. 2A-2C. If unit resistors are the same in the R2R DAC and the resistive network of the instrumentation amplifier 30, the resistors can be closely matched and offset cancelation can be based on a simple resistor ratio.

While resistor string DAC and R2R DAC architectures have been described for illustrative purposes, it will be understood that the principles and advantages discussed herein can be applied to other suitable configurable voltage reference and/or DAC architectures to cancel sensor offsets.

The systems, apparatus, and methods of offset cancelation are described above with reference to certain embodiments. A skilled artisan will, however, appreciate that the principles and advantages of the embodiments can be used for any other systems, apparatus, or methods with a need for offset cancelation, such as sensor offset cancelation.

Such systems, apparatus, and/or methods can be implemented in various electronic devices. Examples of the electronic devices can include, but are not limited to, consumer electronic products, parts of the consumer electronic products, electronic test equipment, automotive electronics, etc. Examples of automotive electronics include, but are not limited to, sensors for seat pressure, pedal pressure, manifold pressure, combustion chamber pressure, and the like, and associated electronics. Examples of the electronic devices can also include memory chips, memory modules, circuits of optical networks or other communication networks, and disk driver circuits. The consumer electronic products can include, but are not limited to, precision instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the systems described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods, apparatus, and systems described herein may be embodied in a variety of other forms. For instance, it will be understood that the principles and advantages discussed herein can be used in any suitable electronic system with a need for offset cancelation. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An apparatus comprising:
    an instrumentation amplifier having at least a first stage, the first stage comprising:
        a first amplifier having at least a first non-inverting input terminal and a first inverting input terminal;
        a second amplifier having at least a second non-inverting input terminal and a second inverting input terminal; and
        a resistive network configured to set a first gain of the first amplifier and set a second gain of the second amplifier, wherein the resistive network is operatively coupled to the first inverting input terminal and the second inverting input terminal; and
    a configurable voltage reference operatively coupled to the instrumentation amplifier and configured to:
        apply a first offset correction voltage to the first inverting input terminal; and
        apply a second offset correction voltage to the second inverting input terminal;
        wherein the first and second offset correction voltages are configured to compensate for an offset voltage in differential voltage signals received at the first non-inverting input terminal and the second non-inverting input terminal; and
        wherein an offset component at the first and second inverting input terminals induced by the configurable voltage reference due to drift of a reference voltage is configured to be ratiometric to an offset component of inputs at the first and second non-inverting input terminals due to the drift of the reference voltage.

2. The apparatus of claim 1, wherein the apparatus comprises an integrated circuit, wherein integrated circuit comprises input contacts configured to receive the differential input signals from a sensor, wherein the integrated circuit comprises the instrumentation amplifier, and wherein the instrumentation amplifier is configured to amplify the differential input signals from the sensor.

3. The apparatus of claim 2, wherein the integrated circuit comprises an other input contact configured to receive a reference voltage of the sensor, and wherein the configurable voltage reference comprises a voltage mode digital-to-analog converter (DAC) operatively coupled to the other input contact.

4. The apparatus of claim 3, wherein the sensor comprises at least one of a pressure sensor or a resistive bridge based transducer.

5. The apparatus of claim 1, wherein configurable voltage reference is configured to apply the first offset correction voltage to the first inverting input via a resistor.

6. The apparatus of claim 1, wherein:
    the instrumentation amplifier comprises a second stage, the second stage comprising a third amplifier having a third inverting input terminal operatively coupled to a first output terminal of the first amplifier and a third non-inverting input terminal operatively coupled to a second output terminal of the second amplifier; and
    the apparatus further comprises a second configurable voltage reference configured to apply a third offset correction voltage to the third non-inverting input terminal and apply a fourth offset correction voltage to the third inverting input terminal to compensate for an offset voltage in the output voltages from the first and second amplifiers.

7. The apparatus of claim 6, further comprising a third configurable voltage reference configured to apply a fifth offset correction voltage to the non-inverting input terminal of the third amplifier.

8. The apparatus of claim 1, wherein the configurable voltage reference comprises a voltage divider having a plurality of tap points configured to provide different voltage levels.

9. The apparatus of claim 8, further comprising an offset correction amplifier configured to amplify a voltage generated by the voltage divider, wherein an output of the offset correction amplifier is electrically connectable to one or more selected resistor strings, and wherein the one or more of resistor strings are electrically connected to the first stage of the instrumentation amplifier.

10. The apparatus of claim 1, wherein the configurable voltage reference comprises an R2R DAC.

11. The apparatus of claim 1, wherein the resistive network comprises:
    a first configurable impedance operatively coupled between the first inverting input terminal and the second inverting input terminal, wherein the first configurable impedance has a first adjustable impedance;

a second configurable impedance operatively coupled between the first inverting input terminal and an output terminal of the first amplifier, wherein the second configurable impedance has a second adjustable impedance; and a third configurable impedance operatively coupled between the second inverting input terminal and an output terminal of the second amplifier, wherein the third configurable impedance has a third adjustable impedance.

12. The apparatus of claim 11, wherein a sum of the first adjustable impedance, the second adjustable impedance, and the third adjustable impedance remains substantially constant when the first adjustable impedance, the second adjustable impedance, and the third adjustable impedance are each adjusted.

13. The apparatus of claim 11, the apparatus is configured to adjust at least one of the first adjustable impedance, the second adjustable impedance, or the third adjustable impedance when a gain of the instrumentation amplifier is adjusted.

14. The apparatus of claim 1, wherein the instrumentation amplifier has a programmable gain, and wherein the resistive network is configured to adjust the programmable gain by adjusting one or more configurable impedances.

15. The apparatus of claim 1, wherein the configurable voltage reference is configured to separately control generation of the first offset correction voltage and the second offset correction voltage.

16. A method of compensating for an offset in a sensor output, the method comprising:

receiving, from a sensor, a sensor output at a non-inverting input terminal of a first amplifier included in an instrumentation amplifier, the sensor output comprising an offset component and a signal component;

generating an offset correction signal at a negative input terminal of the first amplifier using a voltage mode digital-to-analog converter (DAC) to substantially cancel the offset component of the sensor output, wherein a resistive structure of the voltage mode DAC is used to convert a digital signal to an analog signal; and amplifying the sensor output using the first amplifier.

17. The method of claim 16, wherein the voltage mode DAC comprises at least one of a resistor string DAC or an R2R DAC.

18. The method of claim 16, further comprising:

receiving, from the sensor, a second sensor output at a non-inverting input terminal of a second amplifier included in the instrumentation amplifier, the second sensor output comprising a second offset component and a second signal component;

generating a second offset correction signal at an inverting input terminal of the second amplifier using the voltage mode DAC to substantially cancel the second offset component of the second sensor output;

amplifying the second sensor output using the second amplifier; and amplifying a difference between outputs of the first amplifier and the second amplifier using a third amplifier.

19. An electronic system comprising:

a sensor configured to generate a differential sensor output, the differential sensor output comprising an offset component and a signal component; and an integrated circuit comprising:

a first amplifier having a first amplifier gain set by a first resistive feedback network, the first amplifier comprising a non-inverting input terminal configured to receive the a positive portion of the differential sensor output and an inverting input terminal operatively coupled to the first resistive feedback network;

a second amplifier having a second amplifier gain set by a second resistive feedback network, the second amplifier comprising a non-inverting input terminal configured to receive the a negative portion of the differential sensor output and an inverting input terminal operatively coupled to the second resistive feedback network;

a configurable voltage reference configured to apply a first offset correction signal to the inverting input terminal of the first amplifier and a second offset correction signal to the inverting terminal of the second amplifier to substantially cancel the offset component of the sensor output; and an input contact configured to receive a reference voltage of the sensor, wherein the configurable voltage reference is electrically coupled to the input contact.

20. The system of claim 19, wherein the sensor comprises at least one of a pressure sensor or a resistive bridge-based sensor.

21. The system of claim 19, wherein the configurable voltage reference comprises at least one of a resistor string DAC or an R2R DAC.

22. The system of claim 19, wherein the configurable voltage reference comprises a voltage mode DAC.

23. The system of claim 19, wherein the configurable voltage reference comprises a voltage mode DAC, and wherein a resistive structure of the voltage mode DAC is used to convert a digital signal to an analog signal.

* * * * *